: US006284428B1

United States Patent
Hirosaki et al.

(10) Patent No.: US 6,284,428 B1
(45) Date of Patent: Sep. 4, 2001

(54) UNDERCOATING COMPOSITION FOR PHOTOLITHOGRAPHIC RESIST

(75) Inventors: Takako Hirosaki, Kanagawa-ken; Etsuko Iguchi, Machida; Masakazu Kobayashi, Chigasaki, all of (JP)

(73) Assignee: Tokyo Ohka Kogyo Co., Ltd,, Kanagawa-ken (JP)

( * ) Notice: Subject to any disclaimer, the term of this patent is extended or adjusted under 35 U.S.C. 154(b) by 0 days.

(21) Appl. No.: 09/493,098

(22) Filed: Jan. 28, 2000

(30) Foreign Application Priority Data

Jan. 28, 1999 (JP) .................................. 11-020506
Jan. 28, 1999 (JP) .................................. 11-020507
Jan. 28, 1999 (JP) .................................. 11-020508

(51) Int. Cl.⁷ .................................................. G03F 7/004
(52) U.S. Cl. ....................................... 430/270.1; 430/927
(58) Field of Search ............................. 430/270.1, 927

(56) References Cited

U.S. PATENT DOCUMENTS

| 5,545,696 | * | 8/1996 | Rardon et al. ........... 525/375 |
| 5,756,255 | | 5/1998 | Sato et al. ............... 430/270.1 |
| 5,851,738 | * | 12/1998 | Thackeray et al. ..... 430/327 |
| 5,886,102 | | 3/1999 | Sinta et al. .............. 525/154 |
| 5,916,729 | * | 6/1999 | Kobayashi et al. ...... 430/270.1 |
| 5,925,495 | * | 7/1999 | Sato et al. ............... 430/270.1 |
| 5,939,236 | * | 8/1999 | Pavelchek et al. ...... 430/273.1 |
| 5,939,510 | | 8/1999 | Sato et al. ............... 528/128 |
| 6,165,697 | * | 12/2000 | Thackeray et al. ..... 430/325 |

FOREIGN PATENT DOCUMENTS

| 0 813 114 | 12/1997 | (EP) . |
| 9-236915 | 9/1997 | (JP) . |
| 10-228113 | 8/1998 | (JP) . |
| 10-301268 | 11/1998 | (JP) . |
| 97/07145 | 2/1997 | (WO) . |

OTHER PUBLICATIONS

Derwent abstract of EP 542008, 5–1993.*

* cited by examiner

*Primary Examiner*—Janet Baxter
*Assistant Examiner*—Rosemary Ashton
(74) *Attorney, Agent, or Firm*—Wenderoth, Lind & Ponack, L.L.P.

(57) ABSTRACT

Disclosed is a novel undercoating solution for the formation of an antireflection undercoating layer to intervene between the surface of a substrate and a photoresist layer to be patterned in the manufacturing process of semiconductor devices with an object to prevent adverse influences of the light reflecting at the substrate surface on the cross sectional profile of the patterned resist layer. The undercoating composition is a uniform solution which comprises:

(A) a nitrogen-containing organic compound having, in a molecule, at least two amino groups substituted by at least one substituent group selected from the group consisting of hydroxyalkyl groups and alkoxyalkyl groups such as an N,N-substituted benzoguanamine compound;

(B) an organic acid or an inorganic acid of which the acid residue contains at least one atom of sulfur such as methanesulfonic acid and dodecylbenzene sulfonic acid; and (C) an organic solvent such as propyleneglycol monomethyl ether. The undercoating solution further optionally contains a light-absorbing compound such as bis (4-hydroxyphenyl) sulfone and 9-hydroxymethyl anthracene.

13 Claims, No Drawings

U.S. 6,284,428 B1

UNDERCOATING COMPOSITION FOR PHOTOLITHOGRAPHIC RESIST

BACKGROUND OF THE INVENTION

The present invention relates to an undercoating composition for photolithographic resist in the manufacture of various kinds of electronic devices such as semiconductor devices and liquid crystal display panels. More particularly, the invention relates to a coating composition for the formation of an undercoating layer between the surface of a substrate and a layer of a photoresist composition which is patterned by patternwise exposure to actinic rays such as excimer laser beams to give a patterned resist layer having an excellently orthogonal cross sectional profile without irregularity such as trailing skirts and notchings.

In the patternwise exposure of a photoresist layer on a substrate surface with actinic rays in the manufacture of very fine semiconductor devices by utilizing the photolithographic technology for patterning of the photoresist layer, a problem is encountered that the resist layer obtained by patterning has a more or less irregular cross sectional profile by the influences of the standing waves due to the reflection of the exposure light at the substrate surface disadvantageously affecting the results of the subsequent processes utilizing the patterned resist layer as a masking. It is conventionally practiced accordingly to provide an antireflection film as an undercoating layer between the substrate surface and the photoresist layer with an object to solve this problem.

Along with the trend in the electronic technology toward more and more increasing fineness of semiconductor devices such as integrated circuits, the actinic rays for patternwise exposure of the photoresist layer is also under continuous shift toward those of a shorter wavelength such as KrF and ArF excimer laser beams as well as X-rays and electron beams. When excimer laser beams are used as the exposure light, the antireflection film on the substrate surface is formed by using a variety of undercoating compositions comprising, as the essential ingredients, a film-forming resinous compound, a light-absorbing compound to absorb the reflecting light from the substrate surface and a crosslinking agent to effect thermal crosslinking of the ingredients. In Japanese Patent Kokai 8-87115, 9-292715 and 10-228113, for example, an undercoating composition is disclosed which contains a crosslinking agent substituted by hydroxyalkyl groups and/or alkoxyalkyl groups, a dye compound selected from benzophenone compounds, diphenylsulfone compounds and sulfoxide compounds as the light-absorbing agent and an acrylic resin as the film-forming ingredient.

Investigations are now under way to develop a film-forming resin which is imparted with light-absorptivity by introducing light-absorbing substituent groups to the skeletal structure of the resin molecules. Examples of an undercoating composition containing such a dual-service resinous compound heretofore proposed include the antireflection undercoating compositions comprising two essential ingredients exemplified by the antireflection undercoating composition disclosed in Japanese Patent Kokai 10-204328 which contains a resin as a binder having quinolinyl groups, optionally, substituted by a heterocyclic group with an atom of nitrogen, oxygen or sulfur as the heteroatom, phenanthrenyl groups, acridinyl groups or alkyleneanthryl groups and a crosslinking agent such as glycoluril and the antireflection undercoating composition disclosed in WO 97/07145 which contains a resin obtained by the polymerization of a dye compound substituted by a group having an anthracene ring or naphthalene ring with an epoxy resin and a crosslinking agent such as melamine, urea, benzoguanamine and glycoluril.

Although the antireflection undercoating film formed by using the above described undercoating compositions is in fact effective to some extent for improving the cross sectional profile of the patterned resist layer formed thereon by suppressing the adverse influences of the standing waves at least when fineness of resist patterning is within a conventional range, the improvements obtained thereby are not quite satisfactory when further upgrading is required for the accuracy and fineness of the patterned resist layer resulting in irregularity in the cross sectional profile of the patterned resist layer such as skirt trailing and notching at the base part of the resist layer in contact with the substrate surface not to give an excellently orthogonal cross sectional profile.

A problem recently raised in connection with an antireflection undercoating composition containing a light-absorbing compound as a separate ingredient is contamination of various parts of the apparatuses by the deposition of the light-absorbing compound which is sometimes liable to sublimation.

Besides, a further proposal is made in Japanese Patent Kokai 10-301268 for an antireflection coating composition comprising hexamethoxymethyl melamine, propyleneglycol monomethyl ether acetate and 2,4-dimethylbenzene sulfonic acid, which, however, does not give an antireflection undercoating film capable of fully suppressing the adverse influences of standing waves and controlling the cross sectional profile of the patterned resist layer.

SUMMARY OF THE INVENTION

The present invention accordingly has an object, in view of the above described problems and disadvantages in the undercoating compositions of the prior art, to provide a novel and improved undercoating composition for the formation of an antireflection undercoating film in the photolithographic patterning of a photoresist layer, by use of which a patterned resist layer having an excellently orthogonal cross sectional profile standing upright on the substrate surface without irregularity such as trailing skirts and notchings can be obtained even by the use of actinic rays of short wavelengths for light-exposure including not only excimer laser beams but also X-rays and electron beams for the purpose of accomplishing increased fineness of patterning. The invention further has an object to provide an undercoating composition for photolithography capable of giving an undercoating layer exhibiting a high etching rate in compliance with the trend in the photoresist layer toward a smaller and smaller thickness of the layer.

Thus, the undercoating composition for photolithographic resist provided by the present invention is a uniform solution which comprises:

(A) a nitrogen-containing organic compound having, in a molecule, at least two amino groups substituted by at least one substituent group selected from hydroxyalkyl groups and alkoxyalkyl groups;

(B) an organic acid or an inorganic acid of which the acid residue contains at least one atom of sulfur; and (C) an organic solvent.

As a first embodiment of the above defined undercoating composition, the invention provides an undercoating composition for photolithographic resist in the form of a uniform solution which comprises:

(A1) a benzoguanamine compound represented by the general formula

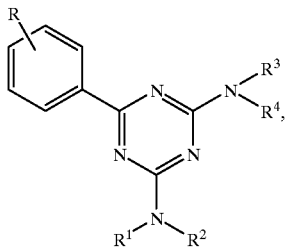

(I)

in which R is a hydrogen atom or a monovalent hydrocarbon group and at least two of $R^1$, $R^2$, $R^3$ and $R^4$ are each a hydroxyalkyl group or an alkoxyalkyl group, the rest, if any, each being a hydrogen atom, or an oligomer thereof;

(B) an acid of which the acid residue contains at least one atom of sulfur; and (C) an organic solvent.

As a second embodiment of the above defined undercoating composition, the undercoating composition of the invention for photolithographic resist in the form of a uniform solution comprises:

(A) a nitrogen-containing organic compound defined above as the component (A);

(B1) an organic acid of which the acid residue has a hydrocarbon group substituted for at least a part of the hydrogen atoms by fluorine atoms;

(C) an organic solvent; and (D) a light-absorbing compound.

As a third embodiment of the above defined undercoating composition, the invention provides an undercoating composition for photolithographic resist in the form of a uniform solution which comprises:

(A) a nitrogen-containing organic compound having, in a molecule, at least two amino groups substituted by at least one substituent group selected from hydroxyalkyl groups and alkoxyalkyl groups;

(B2) an acid selected from the group consisting of aliphatic carboxylic acids, aliphatic sulfonic acids, alkylbenzene carboxylic acids, alkylbenzene sulfonic acids and inorganic sulfur-containing acids;

(C) an organic solvent; and (D) a light-absorbing compound.

DETAILED DESCRIPTION OF THE PREFERRED EMBODIMENTS

As is described above, the undercoating composition according to the present invention comprises, as the essential ingredients, the components (A), (B) and (C), of which the component (C) is an organic solvent to dissolve the other essential ingredients and optional additives to form a uniform solution. The component (A), which is a nitrogen-containing organic compound having, in a molecule, at least two amino groups substituted by at least one substituent group selected from hydroxyalkyl groups and alkoxyalkyl groups, is, in particular according to the first embodiment of the invention, (A1) a benzoguanamine compound represented by the above given general formula (I), in which R is a hydrogen atom or a monovalent hydrocarbon group and at least two of $R^1$, $R^2$, $R^3$ and $R^4$ are each a hydroxyalkyl group or an alkoxyalkyl group, the rest, if any, each being a hydrogen atom, or an oligomer thereof. While the monovalent hydrocarbon group denoted by R in the general formula (I) can be selected preferably from the group consisting of alkyl groups, aralkyl groups and aryl groups, it is more preferable that the group denoted by R is a hydrogen atom.

The hydroxyalkyl group which can be the group denoted by each of $R^1$ to $R^4$ is preferably a hydroxyalkyl group having 1 to 4 carbon atoms or, more preferably, hydroxymethyl group. On the other hand, the alkoxyalkyl group is preferably that of which the alkoxy group and alkyl group each have 1 to 4 carbon atoms or, more preferably, selected from methoxymethyl, ethoxymethyl, propoxymethyl and butoxymethyl groups. Although each of the groups denoted by $R^1$ to $R^4$ can be the same as or different from the others, it is essential that at least two of the four are the above mentioned hydroxyalkyl groups or alkoxyalkyl groups, the rest, if any, each being a hydrogen atom. It is preferable that the two amino groups bonded to the triazine ring are each substituted by at least one hydroxyalkyl group or alkoxyalkyl group. The component (A1) is not limited to the above described benzoguanamine compound per se but can be an oligomer of the benzoguanamine compound.

A variety of commercial products produced by Mitsui Cyanamid Co. and available on the market can be used as the component (A1) in the inventive undercoating composition including Cymel 1123 as a methoxymethylated ethoxymethylated benzoguanamine, Cymel 1123-10 as a methoxymethylated butoxymethylated benzoguanamine, Cymel 1128 as a butoxymethylated benzoguanamine and Cymel 1125-80 as a methoxymethylated ethoxymethylated benzoguanamine containing carboxyl groups as preferable ones. A benzoguanamine compound and a benzoguanamine oligomer sold under a trade names of SB-201 and BX-55H, respectively, (each a product by Sanwa Chemical Co.) are also suitable as the component (A1).

The above described benzoguanamine compounds and oligomers thereof can be used either singly or as a combination of two kinds or more according to need.

The component (B) in the first embodiment of the inventive undercoating composition is an inorganic acid or an organic acid of which the acid residue contains a sulfur atom. The sulfur-containing inorganic acid is exemplified by sulfuric acid, sulfurous acid and thiosulfuric acid. The sulfur-containing organic acid is exemplified by organic sulfonic acids. Esters of sulfuric acid and sulfurous acid can also be used as the component (B). The component (B) is preferably an organic sulfonic acid represented by the general formula $$R^5\text{---}SO_3H,\qquad(II)$$

in which $R^5$ is an unsubstituted or substituted monovalent hydrocarbon group. The monovalent hydrocarbon group denoted by $R^5$, which can be either saturated or unsaturated and can be straightly linear, branched or cyclic, preferably has 1 to 20 carbon atoms. When the hydrocarbon group is a substituted hydrocarbon group having one or more of substituents, the substituent is exemplified by atoms of a halogen such as fluorine, sulfonic acid group, carboxyl group, hydroxyl group, amino group and cyano group.

The monovalent hydrocarbon group as Rs can be an aromatic hydrocarbon group such as phenyl, naphthyl and anthryl groups, of which phenyl group is particularly preferable. The aromatic hydrocarbon group can optionally be substituted on the aromatic ring structure by an aliphatic group having 1 to 20 carbon atoms which can be saturated or unsaturated or can be straightly linear, branched or cyclic. Besides the aliphatic hydrocarbon groups as the substituent, the aromatic ring structure can be substituted by other substituents such as halogen atoms, e.g., fluorine atoms, sulfonic acid groups, carboxyl groups, hydroxyl groups, amino groups and cyano groups.

Examples of a particularly preferable organic sulfonic acid as the component (B) include nonafluorobutane sulfonic acid, methanesulfonic acid, dodecylbenzene sulfonic acid and trifluoromethane sulfonic acid in respect of the effect of improvement on the cross sectional profile of the patterned resist layer formed on the undercoating layer. These organic sulfonic acids can be used either singly or as a combination of two kinds or more.

The amount of the above described acid as the component (B) in the inventive undercoating composition according to the first embodiment is in the range from 0.1 to 10 parts by weight or, preferably, from 1 to 8 parts by weight per 100 parts by weight of the component (A1).

The inventive undercoating composition is prepared by dissolving the above described components (A1) and (B) as well as other optional ingredients in an organic solvent as the component (C) which is not particularly limitative provided that a uniform solution can be obtained therewith. Examples of suitable organic solvents include ketones such as acetone, methyl ethyl ketone, cyclopentanone, cyclohexanone, methyl isoamyl ketone, 2-heptanone and 1,1,1-trimethyl acetone, polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl, monoethyl, monopropyl, monobutyl and monophenyl ethers thereof, cyclic ethers such as dioxane and esters such as ethyl lactate, methyl acetate, ethyl acetate, butyl acetate, methyl pyruvate, ethyl pyruvate, methyl 3-methoxypropionate and ethyl 3-ethoxypropionate. These organic solvents can be used either singly or as a mixture of two kinds or more.

Though not particularly limitative, the amount of the organic solvent as the component (C) is preferably such that the resultant solution contains the components (A1) and (B) in a total concentration in the range from 5 to 20% by weight.

It is optional according to need that the inventive undercoating composition is admixed with a surface active agent in an amount up to 2000 ppm by weight relative to the solid content in the solution with an object for improvement of the coating workability of the solution and prevention of striation. Several commercial products of fluorine-containing surface active agents are particularly suitable for this purpose including Surflons SC-103 and SR-100 (each a product by Asahi Glass Co.), EF-351 (a product by Tohoku Hiryou Co.) and Fluorads Fc-431, Fc-135, Fc-98, Fc-430 and Fc-176 (each a product by Sumitomo 3M Co.).

The undercoating composition of the present invention according to the second embodiment comprises, in addition to the essential components (A), (B1) and (C), a light-absorbing compound as the component (D).

The component (A) is a nitrogen-containing organic compound having at least two amino groups substituted by hydroxyalkyl and/or alkoxyalkyl groups. Examples of suitable nitrogen-containing organic compounds, which should be substituted by hydroxyalkyl and/or alkoxyalkyl groups for the hydrogen atoms on the amino groups, include melamine, urea, guanamine, acetoguanamine, benzoguanamine, glycoluril, succinyl amide and ethyleneurea. The substitution reaction can be performed according to a conventional method by reacting these compounds in boiling water with formaldehyde to effect methylolation followed, if necessary, by an alkoxylation reaction of the methylolated compound with a lower alcohol such as methyl, ethyl, propyl, isopropyl, n-butyl and isobutyl alcohols.

Among the above described compounds suitable as the component (A), particularly preferable are those derived from melamine, benzoguanamine or glycoluril or, more preferably, from a triazine compound such as melamine and benzoguanamine or, most preferably, from a triazine compound by methoxymethylation.

The melamine derivatives and benzoguanamine derivatives can be in the form of an oligomer such as a dimer or trimer. The degree of substitution for the amino-hydrogen atoms therein is preferably such that each triazine ring on an average has at least 3 but less than 6 methylol groups or alkoxymethyl groups.

A variety of commercial products available on the market can be used as the component (A) including, in addition to the Cymel products (each a product by Mitsui Cyanamid Co.) given as the examples of the component (A1) in the first embodiment, MX-750 having 3.7 methoxymethyl groups on an average per triazine ring and MW-30 having 5.8 methoxymethyl groups on an average per triazine ring (each a product by Sanwa Chemical Co.), Cymels 300, 301, 303, 350, 370, 771, 325, 327, 703 and 712 each as a methoxymethylated melamine, Cymels 235, 236, 238, 212, 253 and 254 each as a methoxymethylated butoxymethylated melamine, Cymels 506 and 508 each as a butoxymethylated melamine, Cymel 1141 as a methoxymethylated isobutoxymethylated melamine containing carboxyl groups, Cymel 1170 as a butoxymethylated glycoluril and Cymel 1172 as a methylolated glycoluril. These nitrogen-containing compounds can be used either singly or as a mixture of two kinds or more according to need.

When the patternwise exposure of the photoresist layer is performed by using KrF excimer laser beams having a wavelength of about 248 nm, the component (A) is selected preferably from the benzoguanamine derivatives among the above named commercial products including Cymels 1123, 1123-10, 1128 and 1125-80 in respect of the low transmissivity to the laser beams of the wavelength. Cymel 1125-80 is more preferable as a methoxymethylated ethoxymethylated benzoguanamine having carboxyl groups.

The component (B1) in this second embodiment is preferably an organic acid selected from the group consisting of aliphatic carboxylic and sulfonic acids and alkylbenzene carboxylic and sulfonic acids, of which a part of the hydrogen atoms in the acid residue are substituted by fluorine atoms.

The above mentioned aliphatic carboxylic or sulfonic acid is represented by the general formula $$R^6\text{---}X, \qquad (III)$$

in which $R^6$ is a fluorine-substituted, saturated or unsaturated aliphatic hydrocarbon group or, preferably, alkyl group having 1 to 20 carbon atoms and X is a carboxylic group —COOH or sulfonic acid group —SO$_3$H. The structure of the aliphatic hydrocarbon group denoted by $R^1$ can be straightly linear, branched or cyclic and can optionally be substituted by one or more of sulfonic acid groups, carboxyl groups, hydroxyl groups, amino groups and/or cyano groups.

On the other hand, the alkylbenzene carboxylic or sulfonic acid as a class of the acids suitable as the component (B1) is represented by the general formula

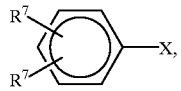
(IV)

in which X has the same meaning as defined for the formula (III) given above and at least one of the two $R^7$ groups is a fluorine-substituted alkyl group defined in the same way as for $R^6$ in the formula (III), the rest, if any, being a hydrogen atom.

Examples of fluorine-substituted organic acids preferably used as the component (B1) in the second embodiment include trifluoromethane sulfonic acid, pentafluoroethane sulfonic acid, heptafluoropropane sulfonic acid, nonafluorobutane sulfonic acid, trifluoroacetic acid, pentafluoropropionic acid, heptafluorobutyric acid, nonafluorovaleric acid, 4-(trifluoromethyl)benzene sulfonic acid, 4-(trifluoroethyl) benzene sulfonic acid, perfluorododecylbenzene sulfonic acid, 1,2-(tetrafluoroethane) disulfonic acid, tetrafluoroisethionic acid, difluorosulfoacetic acid and tetrafluorotaurine $NH_2$—$CF_2$—$CF_2$—$SO_3H$, of which trifluoromethane sulfonic acid and nonafluorobutane sulfonic acid are particularly preferable in respect of the improving effect on the cross sectional profile of the patterned resist layer at the base part.

The above named various fluorine-containing organic acids as the component (B1) can be used either singly or as a combination of two kinds or more. The amount of the component (B1) in the inventive undercoating composition according to the second embodiment is selected usually in the range from 0.1 to 10 parts by weight or, preferably, from 1 to 8 parts by weight per 100 parts by weight of the component (A) though dependent on the types of the acid.

In addition to the above described components (A) and (B1) as well as the component (C) which is an organic solvent selected from the same classes of organic solvents exemplified previously in connection with the first embodiment of the invention, the undercoating composition according to this second embodiment further comprises the component (D) which is a light-absorbing compound which should have high absorptivity to the light used for the patternwise light-exposure of the photoresist layer provided on the undercoating layer within the characteristic wavelength region of the photosensitivity of the resist so as to prevent the adverse influences by the standing waves of the reflecting light at the substrate surface or irregular reflection of the light at the stepped level difference on the substrate surface.

Organic compounds of various classes can be used for the purpose including salicylate compounds, benzophenone compounds, benzotriazole compounds, cyanoacrylate compounds, azo compounds, polyene compounds, anthraquinone compounds, bisphenyl sulfone compounds, bisphenyl sulfoxide compounds and anthracene compounds although any of these compounds can be used either singly or as a combination of two kinds or more.

Preferable among the above named various types of compounds as the component (D) in respect of good miscibility with the component (A) or solubility in the organic solvent as the component (C), suppression of intermixing between layers and reaction promoting activity for the thermal crosslinking of the component (A) are those belonging to the classes of benzophenone compounds, bisphenylsulfone compounds, bisphenyl sulfoxide compounds or anthracene compounds or, more preferably, polyhydroxy compounds including polyhydroxybenzophenone compounds, i.e. benzophenone compounds having at least two hydroxyl groups in a molecule, bisphenyl sulfone compounds having at least two hydroxyl groups in a molecule, bisphenyl sulfoxide compounds having at least two hydroxyl groups in a molecule or anthracene compounds having at least one hydroxyl or hydroxyalkyl group in a molecule. The anthracene compounds are the most preferable among the above named classes of the compounds although any of them can be used either singly or as a combination of two kinds or more.

Examples of the polyhydroxybenzophenone compounds include 2,4-dihydroxy benzophenone, 2,3,4-trihydroxy benzophenone, 2,2',4,4'-tetrahydroxy benzophenone, 2,2',5,6'-tetrahydroxy benzophenone, 2,2'-dihydroxy-4-methoxy benzophenone, 2,6-dihydroxy-4-methoxy benzophenone, 2,2'-dihydroxy-4,4'-dimethoxy benzophenone, 4-dimethylamino-2',4'-dihydroxy benzophenone and 4-dimethylamino-3',4'-dihydroxy benzophenone.

Examples of the polyhydroxy bisphenyl sulfone and sulfoxide compounds include bis(hydroxyphenyl) sulfone and sulfoxide compounds and bis(polyhydroxyphenyl) sulfone and sulfoxide compounds exemplified by bis(4-hydroxyphenyl) sulfone, bis(3,5-dimethyl-4-hydroxyphenyl) sulfone, bis(2,3-dihydroxyphenyl) sulfone, bis(5-chloro-2,3-dihydroxyphenyl) sulfone, bis(2,4-dihydroxyphenyl) sulfone, bis(2,4-dihydroxy-6-methylphenyl) sulfone, bis(5-chloro-2,4-dihydroxyphenyl) sulfone, bis(2,5-dihydroxyphenyl) sulfone, bis(3,4-dihydroxyphenyl) sulfone, bis(3,5-dihydroxyphenyl) sulfone, bis(2,3,4-trihydroxyphenyl) sulfone, bis(2,3,4-trihydroxy-6-methylphenyl) sulfone, bis(5-chloro-2,3,4-trihydroxyphenyl) sulfone, bis(2,4,6-trihydroxyphenyl) sulfone, bis(5-chloro-2,4,6-trihydroxyphenyl) sulfone, bis(4-hydroxyphenyl) sulfoxide, bis(3,5-dimethyl-4-hydroxyphenyl) sulfoxide, bis(2,3-dihydroxyphenyl) sulfoxide, bis(5-chloro-2,3-dihydroxyphenyl) sulfoxide, bis(2,4-dihydroxyphenyl) sulfoxide, bis(2,4-dihydroxy-6-methylphenyl) sulfoxide, bis(5-chloro-2,4-dihydroxyphenyl) sulfoxide, bis(2,5-dihydroxyphenyl) sulfoxide, bis(3,4-dihydroxyphenyl) sulfoxide, bis(3,5-dihydroxyphenyl) sulfoxide, bis(2,3,4-trihydroxyphenyl) sulfoxide, bis(2,3,4-trihydroxy-6-methylphenyl) sulfoxide, bis(5-chloro-2,3,4-trihydroxyphenyl) sulfoxide, bis(2,4,6-trihydroxyphenyl) sulfoxide and bis(5-chloro-2,4,6-trihydroxyphenyl) sulfoxide.

The anthracene compound having at least one hydroxyl or hydroxyalkyl group in a molecule should have a condensed ring structure of anthracene substituted by substituents thermally crosslinkable with the component (A). Such an anthracene compound is represented by the general formula

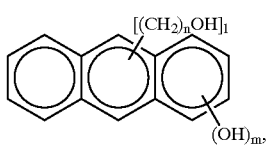
(V)

in which the subscript n is a positive integer of 1 to 10, the subscript m is 0 or a positive integer not exceeding 8 and the subscript 1 is 0 or a positive integer not exceeding 6 with the proviso that at least either one of m and 1 is not 0.

Particular examples of the anthracene compounds preferable as the component (D) include 1-hydroxy anthracene, 9-hydroxy anthracene, 1,2-dihydroxy anthracene, 1,5-dihydroxy anthracene, 9,10-dihydroxy anthracene, 1,2,3-trihydroxy anthracene, 1,2,3,4-tetrahydroxy anthracene, 1,2,3,4,5,6-hexahydroxy anthracene, 1,2,3,4,5,6,7,8-octahydroxy anthracene, 1-hydroxymethyl anthracene, 9-hydroxymethyl anthracene, 9-hydroxyethyl anthracene, 9-hydroxyhexyl anthracene, 9-hydroxyoctyl anthracene and 9,10-di(hydroxymethyl) anthracene.

Besides the anthracene compounds represented by the general formula (V), anthracene carboxylic acids or, in particular, 9-anthracene carboxylic acid, can be used suitably.

Among the above named anthracene compounds, 9-hydroxymethyl anthracene and 9-anthracene carboxylic acid are particularly preferable in respect of high light absorptivity in addition to the good thermal crosslinkability and high effectiveness for prevention of intermixing of layers.

The amount of the light-absorbing compound as the component (D) in the inventive undercoating composition according to the second embodiment of the invention is in the range from 5 to 70% by weight or, preferably, from 10 to 60% by weight based on the total amount of the components (A), (B1) and (D).

The inventive undercoating composition according to the third embodiment of the invention comprises, as the essential ingredients, the components (A), (B2), (C) and (D), of which the components (A), (C) and (D) can be the same ones as those described above for the second embodiment. The third embodiment is characterized by the use of a specific acid as the component (B2), which is selected from aliphatic carboxylic acids, aliphatic sulfonic acids, alkylbenzene carboxylic acids, alkylbenzene sulfonic acids and sulfur containing inorganic acids.

The aliphatic carboxylic or sulfonic acid is represented by the general formula $$R^8-X,\quad\text{(VI)}$$

in which $R^8$ is a substituted or unsubstituted aliphatic monovalent hydrocarbon group having 1 to 20 carbon atoms or, in particular, alkyl group and X is a carboxyl group —COOH or sulfonic acid group —SO$_3$H. The alkylbenzene carboxylic or sulfonic acid is represented by the general formula

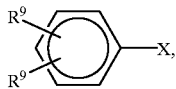

(VII)

in which X has the same meaning as defined above and at least one of the two $R^9$ groups is an alkyl group having 1 to 20 carbon atoms, which may be straightly linear, branched or cyclic in structure, the rest, if any, being a hydrogen atom.

The sulfur-containing inorganic acid as the component (B2) includes those of which the acid residue has a sulfur atom and an oxygen atom exemplified by sulfuric acid, sulfurous acid and thiosulfuric acid.

Among the above described various types of acid compounds, aliphatic sultonic acids, alkylbenzene sulfonic acids and sulfuric acid are preferable and, in particular, methanesulfonic acid, dodecylbenzene sulfonic acid and combinations thereof are more preferable in respect of the high effectiveness for prevention of irregularities in the cross sectional profile of the patterned resist layer in the base part irrespective of the types of the photoresist compositions forming the photoresist layer.

The above described various acid compounds as the component (B2) can be used either singly or as a combination of two kinds or more according to need. The amount of the component (B2) in the undercoating composition according to the third embodiment is in the range from 0.1 to 10 parts by weight or, preferably, from 1 to 8 parts by weight per 100 parts by weight of the component (A).

The above described undercoating composition for photolithographic resist is applicable to the formation of an undercoating layer intervening between the substrate surface and a photoresist layer regardless of the types of the photoresist composition forming the photoresist layer which may be negative-working or positive-working provided that the photoresist layer after patternwise light exposure is developable with an aqueous alkaline solution as the developer. The positive-working photoresist composition include those containing a naphthoquinone diazide compound and a novolak resin, those containing an acid generating agent capable of releasing an acid by exposure to light, a compound having a group capable of increasing the solubility of the compound in an aqueous alkaline solution by decomposition when exposed to light and an alkali-soluble resin and those containing a light-sensitive acid generating agent and an alkali-soluble resin capable of being imparted with increased solubility in an aqueous alkaline solution by decomposition in the presence of an acid. The negative-working photoresist composition includes those containing a light-sensitive acid generating agent, a crosslinking agent and an alkali-soluble resin though not particularly limitative thereto.

A typical procedure for the use of the inventive undercoating composition in the photolithographic patterning works is as follows. Thus, in the first place, the surface of a substrate such as a silicon wafer is coated with the undercoating composition in the form of a solution by using a suitable coating machine such as a spinner followed by a heating treatment at a temperature of 100 to 300° C. to give a dried undercoating layer having a thickness in the range from 0.05 to 0.5 μm. The undercoating layer is insolubilized in an aqueous alkaline solution by the crosslinking reaction as a result of the above mentioned heating treatment.

In the next place, the undercoating layer is overcoated with a photoresist solution by using a spinner followed by drying to form a photoresist layer on the undercoating layer, which is then patternwise exposed to actinic rays such as KrF or ArF excimer laser beams on a suitable light-exposure machine such as a minifying projection exposure machine through a photomask bearing a desired pattern to form a latent image of the pattern. The photoresist layer bearing the latent image is then developed by using an aqueous alkaline developer solution such as a 1 to 10% by weight aqueous solution of tetramethylammonium hydroxide to dissolve away the resist layer in the light-exposed areas or in the areas unexposed to light for the positive-working and negative-working photoresist compositions, respectively, followed by rinse with water and drying to give a patterned resist layer of high fidelity to the photomask pattern.

By virtue of the undercoating layer interposed between the substrate surface and the photoresist layer by using the inventive undercoating composition, a patterned resist layer having an excellently orthogonal cross sectional profile can be obtained without occurrence of irregularities such as trailing skirts and notchings in the base part of the cross section even by using actinic rays of short wavelengths such as excimer laser beams, X-rays and electron beams with an object to accomplish further increased fineness of patterning.

In the following, the undercoating composition of the present invention is described in more detail by way of Examples and Comparative Examples which, however, never limit the scope of the invention in any way.

EXAMPLE 1

An undercoating solution was prepared by dissolving 100 g of Cymel 1125-80 (supra) and 5 g of dodecylbenzene sulfonic acid in 950 g of propyleneglycol monomethyl ether.

Several semiconductor silicon wafers were coated each with the above prepared undercoating solution on a spinner followed by a drying treatment at 90° C. for 90 seconds and then a heat treatment at 180° C. for 5 minutes to form an undercoating layer having a thickness of 100 nm.

In the next place, a photoresist layer was formed on the undercoating layer by using a chemical-amplification positive-working photoresist solution TDUR-DP604 or TDUR-P034 or a chemical-amplification negative-working photoresist solution TDUR-N908 (each a product by Tokyo Ohka Kogyo Co.) on each of the silicon wafers having the undercoating layer.

Thereafter, the photoresist layer on the respective silicon wafers with intervention of an undercoating layer was patternwise exposed to light on a minifying projection exposure machine Nikon NSR-2005EX8A (manufactured by Nikon Co.) through a pattern-bearing photomask followed by a post-exposure baking treatment on a hot plate at 130° C. for 90 seconds and then a development treatment with a 2.38% by weight aqueous solution of tetramethylammonium hydroxide, rinse with water and drying to give a patterned resist layer on the silicon wafer.

The thus obtained patterned resist layer was examined on a scanning electron microscopic photograph for the cross sectional profile of the patterned resist layer to find that all of the line-patterned resist layers had an orthogonal cross sectional profile standing upright on the silicon wafer surface without any irregularities.

EXAMPLE 2

The experimental procedure was substantially the same as in Example 1 excepting for the replacement of dodecylbenzene sulfonic acid in the undercoating solution with the same amount of methanesulfonic acid.

The results of the scanning electron microscopic examination of the cross sectional profile of the line-patterned resist layers were that each of the profiles had vertical side lines in the base part.

EXAMPLE 3

The experimental procedure was substantially the same as in Example 1 excepting for the replacement of dodecylbenzene sulfonic acid in the undercoating solution with the same amount of nonafluorobutane sultonic acid.

The results of the scanning electron microscopic examination of the cross sectional profile of the line-patterned resist layers were that each of the profiles had vertical side lines in the base part.

EXAMPLE 4

The experimental procedure was substantially the same as in Example 1 except that 5 g of dodecylbenzene sulfonic acid in the undercoating solution were replaced with 3.5 g of benzene sulfonic acid monomydrate and the photoresist composition was limited to the chemical-amplification positive-working photoresist compositions TDUR-DP604 and TDUR-P034.

The results of the scanning electron microscopic examination of the cross sectional profile of the line-patterned resist layers were that each of the profiles had vertical side lines in the base part.

EXAMPLE 5

The experimental procedure was substantially the same as in Example 1 excepting that 5 g of dodecylbenzene sulfonic acid in the undercoating solution were replaced with 3.5 g of 2-naphthalene sulfonic acid monohydrate and the photoresist composition was limited to the chemical-amplification positive-working photoresist composition TDUR-P034.

The results of the scanning electron microscopic examination of the cross sectional profile of the line-patterned resist layer were that the cross sectional profile had vertical side lines in the base part.

EXAMPLE 6

The experimental procedure was substantially the same as in Example 1 except that 5 g of dodecylbenzene sulfonic acid in the undercoating solution were replaced with 3.5 g of 1,2-ethane disulfonic acid and the photoresist composition was limited to the chemical-amplification positive-working photoresist composition TDUR-DP604.

The results of the scanning electron microscopic examination of the cross sectional profile of the line-patterned resist layer were that the profile had vertical side lines in the base part.

EXAMPLE 7

The experimental procedure was substantially the same as in Example 1 except that 5 g of dodecylbenzene sulfonic acid in the undercoating solution were replaced with 3.5 g of sulfuric acid and the photoresist composition was limited to the chemical-amplification positive-working photoresist composition TDUR-DP604.

The results of the scanning electron microscopic examination of the cross sectional profile of the line-patterned resist layer were that the profile had vertical side lines in the base part.

COMPARATIVE EXAMPLE 1

An undercoating solution was prepared by dissolving 60 g of bis(4-hydroxyphenyl) sulfone and 60 g of Cymel 1125-80 (supra) in 1200 g of propyleneglycol monomethyl ether.

Several semiconductor silicon wafers were coated each with the above prepared undercoating solution on a spinner followed by a drying treatment at 90° C. for 90 seconds and then a heat treatment at 180° C. for 90 seconds to form an undercoating layer having a thickness of 100 nm.

In the next place, a photoresist layer was formed on the undercoating layer by using a chemical-amplification positive-working photoresist solution TDUR-DP604 or TDUR-P034 or a chemical-amplification negative-working photoresist solution TDUR-N908 (each a product by Tokyo Ohka Kogyo Co.) on each of the silicon wafers having the undercoating layer.

Thereafter, the photoresist layer on the respective silicon wafers was patternwise exposed to light on a minifying projection exposure machine Nikon NSR-2005EX8A (manufactured by Nikon Co.) through a pattern-bearing photomask followed by a post-exposure baking treatment on a hot plate at 130° C. for 90 seconds and then a development treatment with a 2.38% by weight aqueous solution of tetramethylammonium hydroxide, rinse with water and drying to give a patterned resist layer on the silicon wafer.

The thus obtained patterned resist layers were examined on a scanning electron microscopic photograph for the cross sectional profile of the patterned resist layer to find occurrence of trailing skirts in the base part of the patterned resist layers obtained by using the positive-working photoresist solutions and notchings in the base part of the patterned resist layer obtained by using the negative-working photoresist solution.

COMPARATIVE EXAMPLE 2

The experimental procedure was substantially the same as in Comparative Example 1 except that the undercoating solution was prepared by dissolving 100 g of hexamethoxymethyl melamine and 5 g of dodecylbenzene sulfonic acid in 950 g of propyleneglycol monomethyl ether.

The cross sectional profile of the patterned resist layer was examined on a scanning electron microscopic photograph to find that a patterned resist layer having the target line width could not be obtained due to the great influences of standing waves.

EXAMPLE 8

An undercoating solution was prepared by dissolving 1 g of BX-55H (a product by Sanwa Chemical Co.) and 0.1 g of trifluoromethane sulfonic acid in 24 g of propyleneglycol monomethyl ether.

A silicon wafer was coated on a spinner with the above prepared undercoating solution followed by a heat treatment at 150° C. for 90 seconds to form an undercoating layer having a thickness of 100 nm. Further, a photoresist layer was formed on the above formed undercoating layer with a chemicalamplification positive-working photoresist solution (TArF 6a-37, a product by Tokyo Ohka Kogyo Co.).

The photoresist layer was patternwise exposed to ArF excimer laser beams on an ArF light-exposure machine followed by a post-exposure baking treatment on a hot plate at 110° C. for 90 seconds and then subjected to a development treatment with a 2.38% by weight aqueous solution of tetramethylammonium hydroxide followed by rinse with water and drying to give a patterned resist layer.

With this patterned resist layer as an etching mask, an etching treatment was undertaken in an etching apparatus (OAPM-406, manufactured by Tokyo Ohka Kogyo Co.) using a 95:5 mixture of carbon tetrafluoride and oxygen as the etching gas under a pressure of 200 mTorr at a stage temperature of 20° C. and a high-frequency output of 300 watts to measure the etching rates of the resist layer and the undercoating layer, which were 44.7 nm/minute and 81.4 nm/minute, respectively, corresponding to a selectivity ratio of 81.4/44.7=1.82.

EXAMPLE 9

An undercoating solution was prepared by dissolving 100 g of Cymel 1125-80 (supra), 3.5 g of nonafluorobutane sulfonic acid and 100 g of bis(4-hydroxyphenyl) sulfone in 2500 g of propyleneglycol monomethyl ether.

Several semiconductor silicon wafers were coated each with the above prepared undercoating solution on a spinner followed by a drying treatment at 90° C. for 90 seconds and then a heat treatment at 180° C. for 5 minutes to form an undercoating layer having a thickness of 100 nm.

In the next place, a photoresist layer was formed on the undercoating layer by using a chemical-amplification positive-working photoresist solution TDUR-DP604 or TDUR-P034 or a chemical-amplification negative-working photoresist solution TDUR-N908 (each a product by Tokyo Ohka Kogyo Co.) on each of the silicon wafers.

Thereafter, the photoresist layer on the respective silicon wafers was patternwise exposed to light on a minifying projection exposure machine Nikon NSR-2005EX8A (manufactured by Nikon Co.) through a pattern-bearing photomask followed by a post-exposure baking treatment on a hot plate at 130° C. for 90 seconds and then a development treatment with a 2.38% by weight aqueous solution of tetramethylammonium hydroxide, rinse with water and drying to give a patterned resist layer on the silicon wafer.

The results of the scanning electron microscopic examination of the cross sectional profile of the line-patterned resist layers were that all of the line-patterned resist layers had an orthogonal cross sectional profile standing upright on the substrate surface.

EXAMPLE 10

The experimental procedure was substantially the same as in Example 9 except that nonafluorobutane sulfonic acid in the undercoating solution was replaced with the same amount of nonafluorovaleric acid and the photoresist composition was limited to the chemical-amplification positive-working photoresist compositions TDUR-DP604 and TDUR-P034.

The results of the scanning electron microscopic examination of the cross sectional profile of the line-patterned resist layers were that each of the patterned resist layers had a vertical cross sectional profile in the base part.

EXAMPLE 11

The experimental procedure was substantially the same as in Example 9 except that nonafluorobutane sulfonic acid in the undercoating solution was replaced with the same amount of trifluoroacetic acid and the photoresist composition was limited to the chemical-amplification positive-working photoresist composition TDUR-DP604.

The results of the scanning electron microscopic examination of the cross sectional profile of the line-patterned resist layer were that the patterned resist layer had a vertical cross sectional profile in the base part.

EXAMPLE 12

The experimental procedure was substantially the same as in Example 9 except that nonafluorobutane sulfonic acid in the undercoating solution was replaced with the same amount of trifluoromethane sulfonic acid and the photoresist composition was limited to the chemical-amplification positive-working photoresist composition TDUR-DP604.

The results of the scanning electron microscopic examination of the cross sectional profile of the line-patterned resist layer were that the patterned resist layer had a vertical cross sectional profile in the base part.

EXAMPLE 13

The experimental procedure was substantially the same as in Example 9 except that the undercoating solution was prepared by dissolving 50 g of Cymel 1125-80 (supra), 3.5 g of nonafluorobutane sulfonic acid and 50 g of 9-hydroxymethyl anthracene in 2000 g of propyleneglycol monomethyl ether.

The results of the scanning electron microscopic examination of the cross sectional profile of the line-patterned resist layers were that all of the patterned resist layers each had a vertical cross sectional profile in the base part.

COMPARATIVE EXAMPLE 3

An undercoating solution was prepared by dissolving 60 g of Cymel 1125-80 (supra) and 60 g of bis(4-hydroxyphenyl) sulfone in 1200 g of propyleneglycol monomethyl ether.

Several semiconductor silicon wafers were coated each with the above prepared undercoating solution on a spinner followed by a drying treatment at 90° C. for 90 seconds and then a heat treatment at 180° C. for 90 seconds to form an undercoating layer having a thickness of 100 nm.

In the next place, a photoresist layer was formed on the undercoating layer by using a chemical-amplification positive-working photoresist solution TDUR-DP604 or TDUR-P034 (supra) or a chemical-amplification negative-working photoresist solution TDUR-N908 (supra) on each of the silicon wafers having the undercoating layer.

Thereafter, the photoresist layer on the respective silicon wafers was patternwise exposed to light on a minifying projection exposure machine Nikon NSR-2005EX8A (manufactured by Nikon Co.) through a pattern-bearing photomask followed by a post-exposure baking treatment on a hot plate at 130° C. for 90 seconds and then a development treatment with a 2.38% by weight aqueous solution of tetramethylammonium hydroxide, rinse with water and drying to give a patterned resist layer on the silicon wafer.

The results of the scanning electron microscopic examination of the cross sectional profile of the line-patterned resist layers were that trailing skirts were found when the photoresist composition was positive-working and notchings were found in the base part when the photoresist composition was negative-working.

EXAMPLE 14

An undercoating solution was prepared by dissolving 60 g of Cymel 1125-80 (supra), 3.5 g of dodecylbenzene sulfonic acid and 60 g of bis(4-hydroxyphenyl) sulfone in 1300 g of propyleneglycol monomethyl ether.

Several semiconductor silicon wafers were coated each with the above prepared undercoating solution on a spinner followed by a drying treatment at 90° C. for 90 seconds and then a heat treatment at 180° C. for 90 seconds to form an undercoating layer having a thickness of 100 nm.

In the next place, a photoresist layer was formed on the undercoating layer by using a chemical-amplification positive-working photoresist solution TDUR-DP604 or TDUR-P034 or a chemical-amplification negative-working photoresist solution TDUR-N908 (each a product by Tokyo Ohka Kogyo Co.) on each of the silicon wafers having the undercoating layer.

Thereafter, the photoresist layer on the respective silicon wafers was patternwise exposed to light on a minifying projection exposure machine Nikon NSR-2005EX8A (manufactured by Nikon Co.) through a pattern-bearing photomask followed by a post-exposure baking treatment on a hot plate at 130° C. for 90 seconds and then a development treatment with a 2.38% by weight aqueous solution of tetramethylammonium hydroxide, rinse with water and drying to give a patterned resist layer on the silicon wafer.

The results of the scanning electron microscopic examination of the cross sectional profile of the line-patterned resist layers were that all of the line-patterned resist layers had an orthogonal cross sectional profile standing upright on the substrate surface.

EXAMPLE 15

The experimental procedure was substantially the same as in Example 14 excepting for the replacement of dodecylbenzene sulfonic acid in the undercoating solution with the same amount of methanesulfonic acid.

The results of the scanning electron microscopic examination of the cross sectional profile of the line-patterned resist layers were that each of the patterned resist layers had a vertical cross sectional profile in the base part.

EXAMPLE 16

The experimental procedure was substantially the same as in Example 14 excepting for the replacement of dodecylbenzene sulfonic acid in the undercoating solution with the same amount of sulfuric acid.

The results of the scanning electron microscopic examination of the cross sectional profile of the line-patterned resist layers were that each of the patterned resist layers had a vertical cross sectional profile in the base part.

EXAMPLE 17

The experimental procedure was substantially the same as in Example 14 except that the undercoating solution was prepared by dissolving 50 g of Cymel 1125-80 (supra), 5 g of dodecylbenzene sulfonic acid and 50 g of 9-hydroxymethyl anthracene in 2000 g of propyleneglycol monomethyl ether.

The results of the scanning electron microscopic examination of the cross sectional profile of the line-patterned resist layers were that all of the patterned resist layers each had a vertical cross sectional profile in the base part.

What is claimed is:

1. An undercoating composition for photolithographic resist which consists essentially of, as a uniform solution:
    (A1) a benzoguanamine compound represented by the general formula

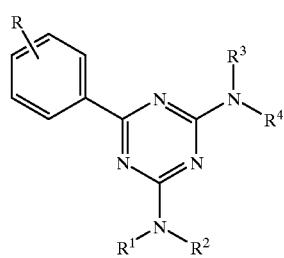

in which R is a hydrogen atom or a monovalent hydrocarbon group and at least two of $R^1$, $R^2$, $R^3$ and $R^4$ are each a hydroxyalkyl group or an alkoxyalkyl group, the rest, if any, each being a hydrogen atom, or an oligomer thereof;
    (B) an organic acid or an inorganic acid of which the acid residue contains at least one atom of sulfur; and
    (C) an organic solvent.

2. The undercoating composition for photolithographic resist as claimed in claim 2 in which the amount of the component (B) is in the range from 0.1 to 10 parts by weight per 100 parts by weight of the component (A1).

3. The undercoating composition for photolithographic resist as claimed in claim 1 in which the monovalent hydrocarbon group denoted by R is a hydrogen atom.

4. The undercoating composition for photolithographic resist as claimed in claim 1 in which the hydroxyalkyl group denoted by $R^1$, $R^2$, $R^3$ or $R^4$ is hydroxymethyl group.

5. The undercoating composition for photolithographic resist as claimed in claim 1 in which the alkoxyalkyl group denoted by $R^1$, $R^2$, $R^3$ or $R^4$ is selected from the group consisting of methoxymethyl group, ethoxymethyl group, propoxymethyl group and butoxymethyl group.

6. An undercoating composition for photolithographic resist which comprises, as a uniform solution:
 (A) a benzoguanamine compound having at least two amino groups substituted by at least one substituent group selected from the group consisting of hydroxyalkyl groups and alkoxyalkyl groups;
 (B1) an organic acid of which the acid residue has a hydrocarbon group wherein fluorine atoms are substituted for at least a part of the hydrogen atoms of the hydrocarbon group;
 (C) an organic solvent; and
 (D) a light-absorbing compound selected from the group consisting of benzophenone compounds, bisphenyl sulfone compounds, bisphenyl sulfoxide compounds and anthracene compounds.

7. The undercoating composition for photolithographic resist as claimed in claim 6 in which the organic acid as the component (B1) is selected from the group consisting of aliphatic carboxylic acids, aliphatic sulfonic acids, alkylbenzene carboxylic acids and alkylbenzene sulfonic acids having at least one fluorine atom substituting for the hydrogen atom.

8. The undercoating composition for photolithographic resist as claimed in claim 7 in which the component (B1) is an aliphatic sulfonic acid having at least one fluorine atom substituting for the hydrogen atom.

9. The undercoating composition for photolithographic resist as claimed in claim 8 in which the component (B1) is trifluoromethane sulfonic acid or nonafluorobutane sulfonic acid.

10. The undercoating composition for photolithographic resist as claimed in claim 6 in which the component (D) is an anthracene compound.

11. The undercoating composition for photolithographic resist as claimed in claim 10 in which the anthracene compound is 9-hydroxymethyl anthracene or 9-anthracene carboxylic acid.

12. The undercoating composition for photolithographic resist as claimed in claim 6 in which the amount of the component (B1) is in the range from 0.1 to 10 parts by weight per 100 parts by weight of the co mpon ent (A).

13. The undercoating composition for photolithographic resist as claimed in claim 6 in which the amount of the component (D) is in the range from 5 to 70% by weight based on the total amount of the components (A), (B1) and (D).

\* \* \* \* \*

UNITED STATES PATENT AND TRADEMARK OFFICE
CERTIFICATE OF CORRECTION

PATENT NO.    : 6,284,428 B1
DATED         : September 4, 2001
INVENTOR(S)   : Takako Hirosaki et al.

It is certified that error appears in the above-identified patent and that said Letters Patent is hereby corrected as shown below:

Column 16,
Line 62, change "claim 2" to -- claim 1 --.

Column 18,
Line 21, change "co mpon ent" to -- component --.

Signed and Sealed this

Second Day of April, 2002

Attest:

JAMES E. ROGAN
*Attesting Officer*   *Director of the United States Patent and Trademark Office*